United States Patent [19]

Ikekawa et al.

[11] Patent Number: 5,499,254
[45] Date of Patent: Mar. 12, 1996

[54] APPARATUS FOR ERROR-CORRECT DECODING IN A DIGITAL DATA COMMUNICATIONS SYSTEM

[75] Inventors: Masao Ikekawa; Toshiyuki Nomura, both of Tokyo, Japan

[73] Assignee: NEC Corporation, Japan

[21] Appl. No.: 299,237

[22] Filed: Aug. 31, 1994

[51] Int. Cl.$^6$ ............................ G06F 11/10; H03M 13/12
[52] U.S. Cl. .................................................. 371/43; 371/44
[58] Field of Search ................................ 371/37.2, 27.4, 371/37.5, 37.7, 43, 38.1, 39.1, 44, 45; 375/94, 95, 99

[56] References Cited

U.S. PATENT DOCUMENTS

| | | | |
|---|---|---|---|
| 4,015,238 | 3/1977 | Davis | 371/43 |
| 4,566,105 | 1/1986 | Oisel et al. | 371/375 |
| 4,649,541 | 3/1987 | Lahmeyer | 371/37.1 |
| 5,331,666 | 7/1994 | Dent | 371/43 |
| 5,351,249 | 9/1994 | Lomp et al. | 371/43 |
| 5,406,570 | 4/1995 | Berrou et al. | 371/43 |

FOREIGN PATENT DOCUMENTS

| | | |
|---|---|---|
| 529909 | 8/1992 | European Pat. Off. . |
| 2238933 | 11/1990 | United Kingdom . |

OTHER PUBLICATIONS

W. Wang, et al., *Phonetically–Based Vector Excitation Coding of Speech at 3.6 kbps, ICASSP 89*, vol. 1, Speech Processing 1, S1, 1989 International Conference on Acoustics, Speech and Signal Processing, May 23–26, 1989.

H. Imai, et al., "*Essential of Error–Control Coding Techniques*", Academic Press, Inc., San Diego, California, pp. 61–72, (1990).

I. A. Gerson, et al., "*Combined Speech and Channel Coding at 11.2 KBPS*", Signal Processing V: Theories and Applications, Elsevier Science Publishers V. B. 1990.

S. Wang, et al., "*Phonetically–Based Vector Excitation Coding of Speech at 3.6 kbps*", Department of Electrical and Computer Engineering, University of California, Santa Barbara, CA 93106, IEEE, 1990, pp. 49–52.

H. Imai, "*Essential of Error–coding Techniques*", Academic Press, Inc., San Diego, California 92101.

*Primary Examiner*—Roy Envall
*Assistant Examiner*—Emmanuel L. Moise
*Attorney, Agent, or Firm*—Ostrolenk, Faber, Gerb & Soffen

[57] ABSTRACT

In order to effectively error-correct decode a plurality of data frames transmitted over a noisy transmission channel, control data is applied to a maximum-likelihood decoder such as to change decoding parameters thereof. The control data is generated based on frame characteristic information obtained from at least one data frame which precedes a data frame currently decoded at the maximum-likelihood decoder. Thus, the error-correct decoding is implemented using estimated correlation between at least two consecutive data frames one of which is under error-correct decoding. Further, a cyclic code decoder is provided in a receiver for checking a transmission error in the output of the maximum-likelihood decoder. The cyclic code decoder issues a check result which is used to change the contents of the control data.

7 Claims, 13 Drawing Sheets

APPARATUS FOR ERROR-CORRECT DECODING IN A DIGITAL DATA COMMUNICATIONS SYSTEM

BACKGROUND OF THE INVENTION

1. Field of the Invention

The present invention relates generally to an apparatus for implementing error-correct decoding in a digital data communications system, and more specifically to such an apparatus wherein a data frame is effectively error-correct decoded using estimated correlation between the data frame under error-correct decoding and one or more than one preceding data frames.

2. Description of Related Art

In order to correct channel bit errors induced during digital data transmission, it is well known in the art to add redundant bits to each binary code word (or data frame) to be transmitted. The code is thus provided with the capability of combating the channel noises.

Error correct (or control) coding for achieving reliable communications over a noisy transmission channel has been discussed in a variety of books. One example thereof is a book entitled "Essentials of Error-control coding Techniques" edited by Hideki IMAI and published 1990 by Academic Press, Inc., San Diego, Calif. 92101, U.S.A. (Prior Reference 1).

Before turning to the present invention it is deemed advantageous to discuss conventional error correct coding with reference to FIGS. 1–4.

FIG. 1 is a block diagram showing a simplified model of a typical digital data communications system (generally depicted by 10) to which the present invention is applicable. The system 10 includes a transmitter 12 and a receiver 14 interconnected via a transmission channel 16.

The transmitter 12 is provided with a message source 18 which can be either a person or a machine (e.g., a digital computer). A source output (depicted by S1), which is to be transmitted to the destination, can be either a continuous (analog) waveform or a sequence of discrete symbols. A source encoder 20 transforms the source output S1 into a sequence of binary digits (bits) denoted by S2.

It is assumed that the message source 18 takes the form of a continuous (analog) source. In such a case, the source encoder 20 involves analog-to-digital conversion. That is, the source output S1 is digitized at a predetermined time interval, and the digitized signal is encoded and usually compressed. Thereafter, the encoded signal (viz., S2) is applied to a convolutional encoder 22. Although not shown in FIG. 1, the output of the encoder 22 (depicted by C) is subject to suitable modulation and then transmitted to the receiver 14 via the transmission channel 16.

As shown in FIG. 1, the receiver 14 includes a maximum-likelihood decoder (viz., Viterbi decoder) 24 and a source decoder 26 from which an estimated message is derived.

Reference is made to FIG. 2 wherein a simplified example of the convolutional encoder 22 is shown in block diagram form.

The encoder 22 includes three delay lines or shift registers (denoted by $D_n$, $D_{n-1}$ and $D_{n-2}$), two modulo-2 adders 40a–40b, and a parallel/serial (P/S) converter 42. Thus, the constraint length (K) of the encoder 22 is 3 (three) while the code rate (R) thereof is ½. The arrangement illustrated in FIG. 2 is well known in the art.

FIG. 3 is a state diagram of the encoder 22. In this figure, two consecutive bits within each oval indicates the bits held in the last two delay lines $D_{n-2}$ and $D_{n-1}$ of FIG. 2, and indicates an encoder state. The encoder states (00), (01), (10) and (11) are connected or looped by solid and broken line arrows. When a bit "1" is applied to the encoder 22, the encoder state is shifted to the other state or returned to the same state via a solid line arrow. On the other hand, when a bit "0" is applied to the encoder 22 then the encoder state is shifted to the other state or returned to the same state via a broken line arrow. The outputs of the convolutional encoder 22, issued in response to each bit applied thereto, are indicated as "00", "01", "10" and "11" beside the corresponding arrows.

The encoder 22 is initially set to the state (00) before a fresh bit sequence is applied. Therefore, when a first bit of the sequence is "0", the encoder state (00) remains unchanged. In this case, the output of the encoder 22 is "00". Following this, if the second bit is "1", the encode 26 takes the state (01) and issues two bits sequence "11". Thereafter, similar operations continues.

It is assumed that the bit sequence S2 applied to the convolutional encoder 22 is $$S2=(0\ 1\ 0\ 0\ 1\ \ldots) \tag{1}$$

Thus, the bit sequence C, issued from the encoder 22 and transmitted over the channel 16, is given by $$C=(00\ 11\ 01\ 11\ 11\ \ldots) \tag{2}$$

The bit sequence C is applied to the receiver 14 as a bit sequence CC (FIG. 1). It is assumed that the bit sequence C has been deteriorated during transmission such that the bit sequence CC is given by $$CC=(01\ 10\ 01\ 01\ 11\ \ldots) \tag{3}$$

For a better understanding of the convolutional encoding and the Viterbi algorithm (under which the decoder 24 operates), it is convenient to rewrite the state diagram of FIG. 3 as a function of time. As is well known in the art, the resulting structure is called a trellis diagram and is illustrated in FIGS. 4–6.

The operation of the convolutional encoder 22 is again described using the trellis diagram of FIG. 4. As in the above, it is assumed that the bit sequence S2 (=0 1 0 0 1 . . .) is applied to the encoder 22. The encoder 22 has been set to the state (00) prior to the bit sequence S2 being initially applied thereto. As mentioned above, when a bit "1" is applied to the encoder 22 at a given time point, the encoder 22 assumes a new state pointed by a solid line arrow at the next time point. On the other hand, when a bit "0" is applied to the encoder 22 at a given time point, the encoder 22 assumes a new state pointed by a broken line arrow at the next time point. Accordingly, the convolutional encoder 22 generates the output C (=00 11 01 11 11 . . . ) as highlighted by bold solid and broken line arrows in FIG. 4.

Each of FIGS. 5 and 6 shows a trellis diagram for discussing the operation of the maximum-likelihood (viz., Viterbi) decoder 24 of FIG. 1.

Each of FIGS. 5 and 6 indicates, at the upper portion thereof, the above mentioned bit sequences S2, C and CC. In FIGS. 5 and 6, each of the numerals above the decoder states enclosed by ellipses is a "decimal number" indicating a path metric. There are two branches or paths leaving and entering each decoder state. At each time unit (t=1, 2, 3, . . . ), one of the two paths entering each decoder state is selected by comparing two path metrics associated with the two paths in question as will be better understood as the description proceeds.

The maximum-likelihood decoder 24 is initialized such that the path metric of the decoder state (00) is 0 (decimal number) while each of the remaining path metrics of the other decoder states (01), (10) and (11) is a sufficiently large number such as 10 (decimal number). These path metrics in decimal numbers are shown in FIG. 5 at t=0.

In FIG. 5, the branch metric (viz., the Hamming distance in this case) between the states $(00)_{t=0}$ and $(00)_{t=1}$ is 1 (one). Similarly, the branch metric between the states $(10)_{t=0}$ and $(00)_{t=1}$ is 1 (one). However, the path metric of the state $(00)_{t=1}$ from the state $(00)_{t=1}$ is 1 (=0+1) (decimal number) while the path metric of the state $(00)_{t=1}$ from the state $(10)_{t=0}$ is 11 (0+10) (decimal number). Accordingly, the path leaving the state $(00)_{t=0}$ and entering the state $(00)_{t=1}$ is selected as a survivor path wherein the path metric is 1. In the similar manner, the survivor paths and the corresponding path metrics of the other states (01), (10), and (11) at t=1 are determined as shown in FIG. 5. The survivor paths until t=1 are highlighted (viz., denoted by bold solid and broken line arrows). The resulting path metrics at t=1 are shown above each decoder state.

FIG. 6 shows the survivor paths from t=0 to t=5, which are highlighted in the figure, together with the path metrics thereof. As shown in FIG. 6, each of the path metrics of the decoder states $(10)_{t=5}$ and $(11)_{t=5}$ exhibits the smallest one. It is to be noted that in order to deal with the case where more than one path metrics exhibit the smallest ones at a particular time point (t=5 in this case), the decoder 24 has been designed such as to select either one thereof. If the path metric of the state $(10)_{t=5}$ is selected as the smallest one, a decoded bit sequence S2' (FIG. 1) outputted from the maximum-likelihood decoder 24 becomes as follows.

$$S2'=(1\ 1\ 1\ 1\ 0\ \ldots) \quad (4)$$

It is understood that the decoded bit sequence S2' in expression (4) differs from the original bit sequence S2 (see expression (1)) which has been applied to the convolutional encoder 22 (FIG. 1).

Accordingly, the above mentioned prior art has encountered the problem in that the maximum-likelihood decoder 24 is not necessarily able to achieve a sufficient error correcting capability. This problem stems from the fact that the error correcting of the prior art is based merely on the redundant bits added at the convolutional encoder 22.

SUMMARY OF THE INVENTION

It is an object of the present invention to provide an apparatus wherein error correction is effectively implemented using estimated correlation between at least two consecutive data frames received.

In brief, the above objects are achieved by a technique wherein in order to effectively error-correct decode a plurality of data frames transmitted over a noisy transmission channel, control data is applied to a maximum-likelihood decoder such as to change decoding parameters thereof. The control data is generated based on frame characteristic information obtained from at least one data frame which precedes a data frame currently decoded at the maximum-likelihood decoder. Thus, the error-correct decoding is implemented using estimated correlation between at least two consecutive data frames one of which is under error-correct decoding. Further, a cyclic code decoder is provided in a receiver for checking a transmission error in the output of the maximum-likelihood decoder. The cyclic code decoder issues a check result which is used to change the contents of the control data.

An aspect of the present invention resides in an apparatus for error-control coding which includes a data transmitter and a data receiver interconnected via a transmission channel. The data receiver includes first means for successively error-correct decoding a plurality of data frames which have been error-correct encoded at the transmitter. The first means changes decoding parameters in response to control data applied thereto. The control data is generated based on one or more than one data frames preceding a data frame currently decoded at the first means. The data receiver further includes second means coupled to the first means for decoding output of the first means. A third means, which is coupled to receive outputs of the first and second means, extracts frame characteristic data therefrom. A fourth means is coupled to the third means, and the fourth means and is responsive to the frame characteristic data and detects one of a plurality of probability variable sets stored in the fourth means. The fourth means applies the one of a plurality of probability variable sets to the first means as the control data.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A first embodiment of the present invention will be discussed with reference to FIGS. 7–11.

Figure 7:
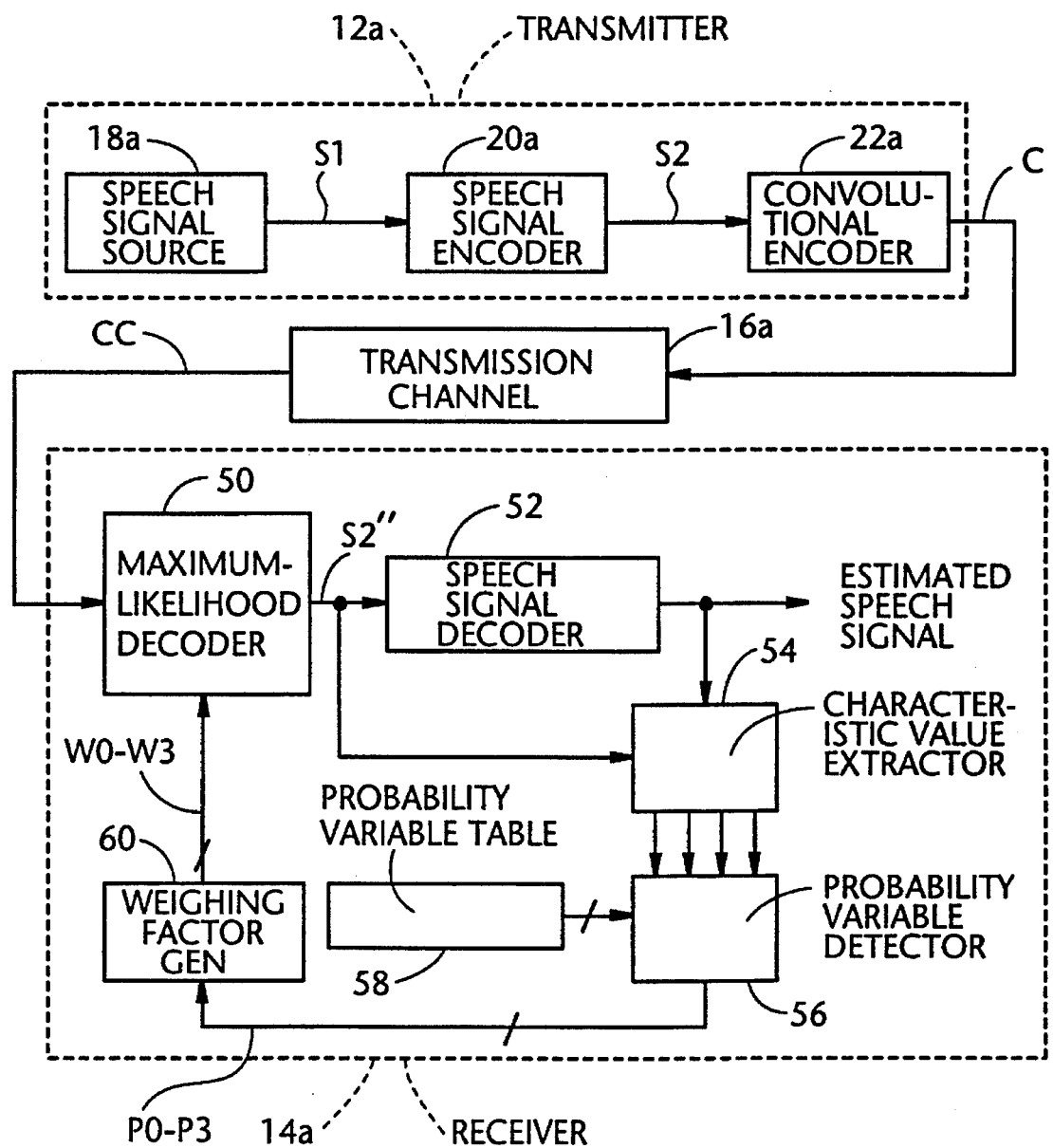
FIG. 7 is a block diagram showing a first embodiment of the present invention.

FIG. 7 schematically shows an arrangement of the first embodiment in block diagram form. The first embodiment generally includes a transmitter 12a interconnected to a receiver 14a via a transmission channel 16a.

Although the present invention will be discussed with reference to a speech signal, it is in no way limited to such an application and is applicable, without departing from the scope of the present invention, to the cases wherein a video signal, an audio signal or the like is processed. The present invention utilizes the fact that two or more than two consecutive data frames usually has a close mutual relation therebetween.

Figure 1:
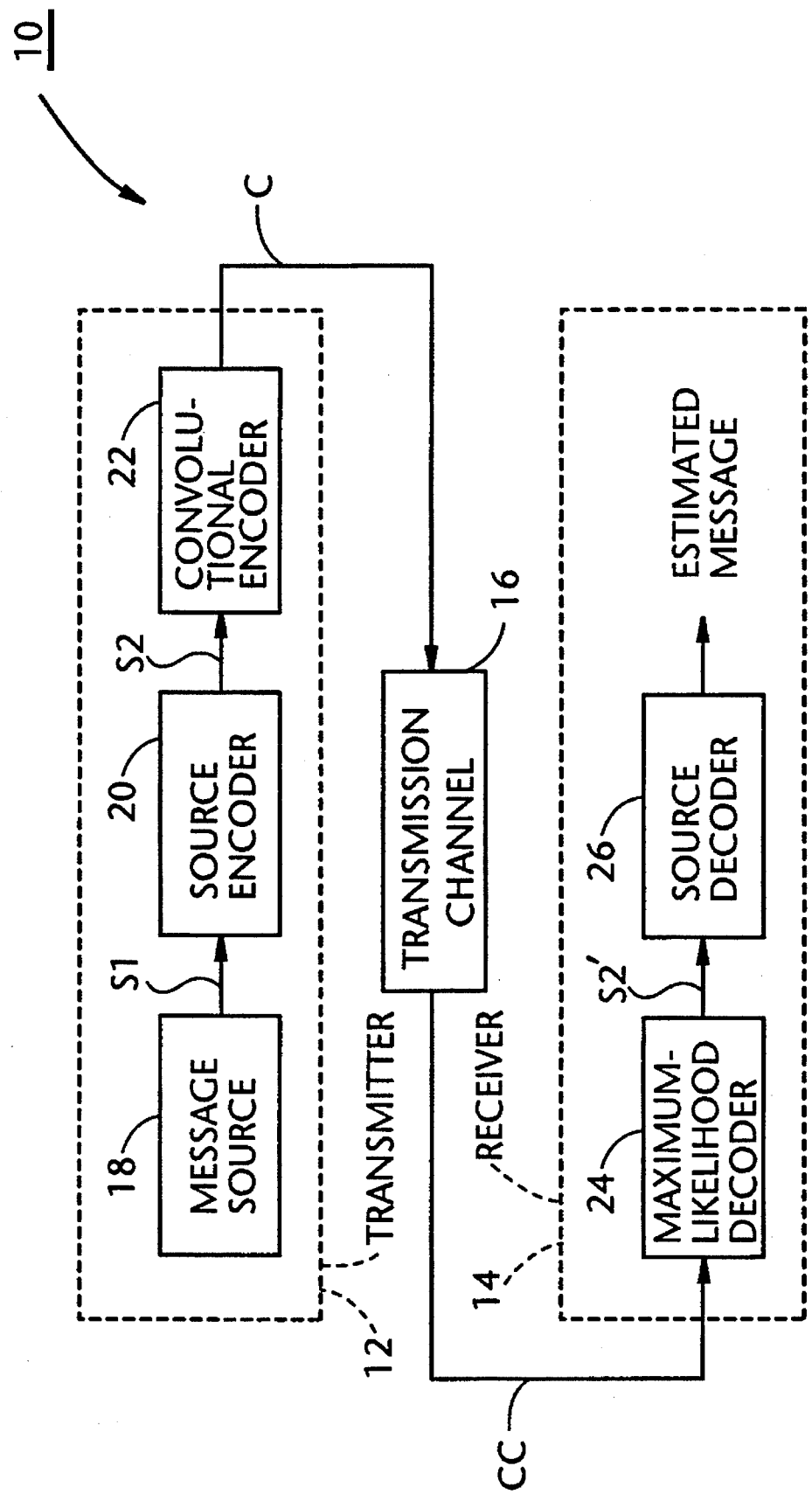
FIG. 1 is a block diagram showing a simplified model of a typical digital data communications system using a convolutional encoding, this figure having being discussed in the opening paragraphs of the instant disclosure.
Figure 2:
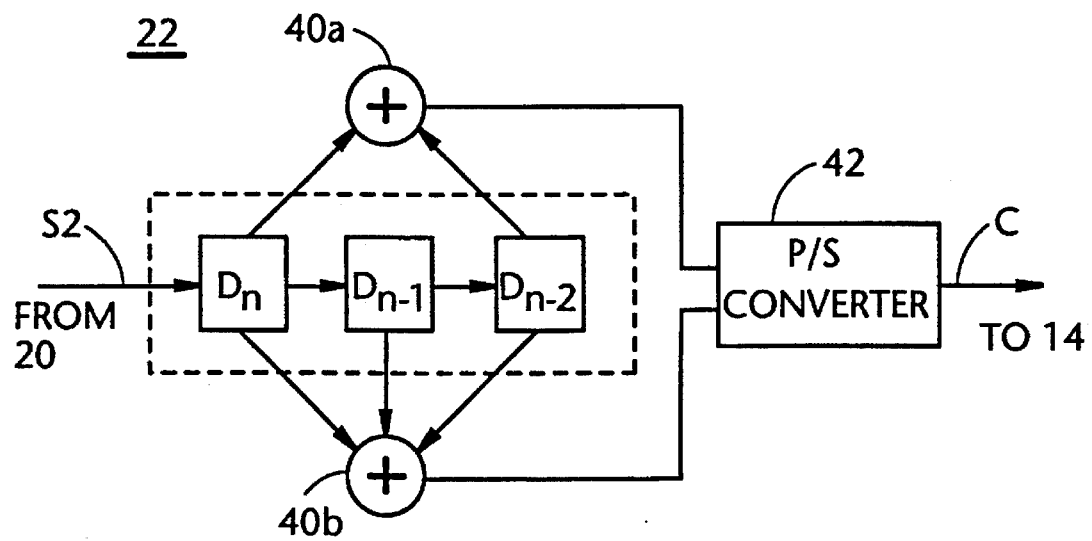
FIG. 2 is a block diagram showing in detail one block in FIG. 1.
Figure 3:
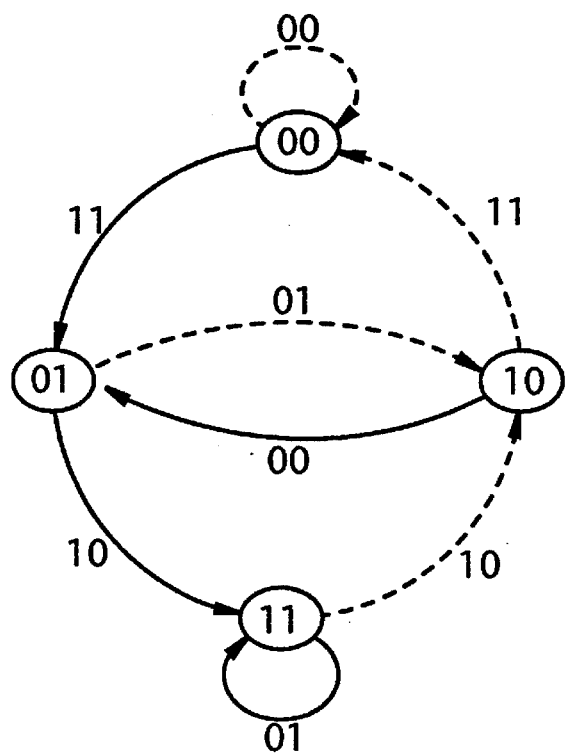
FIG. 3 is a diagram illustrating a plurality of encoder states for describing the operations of the convolutional encoder in FIG. 1.
Figure 4:
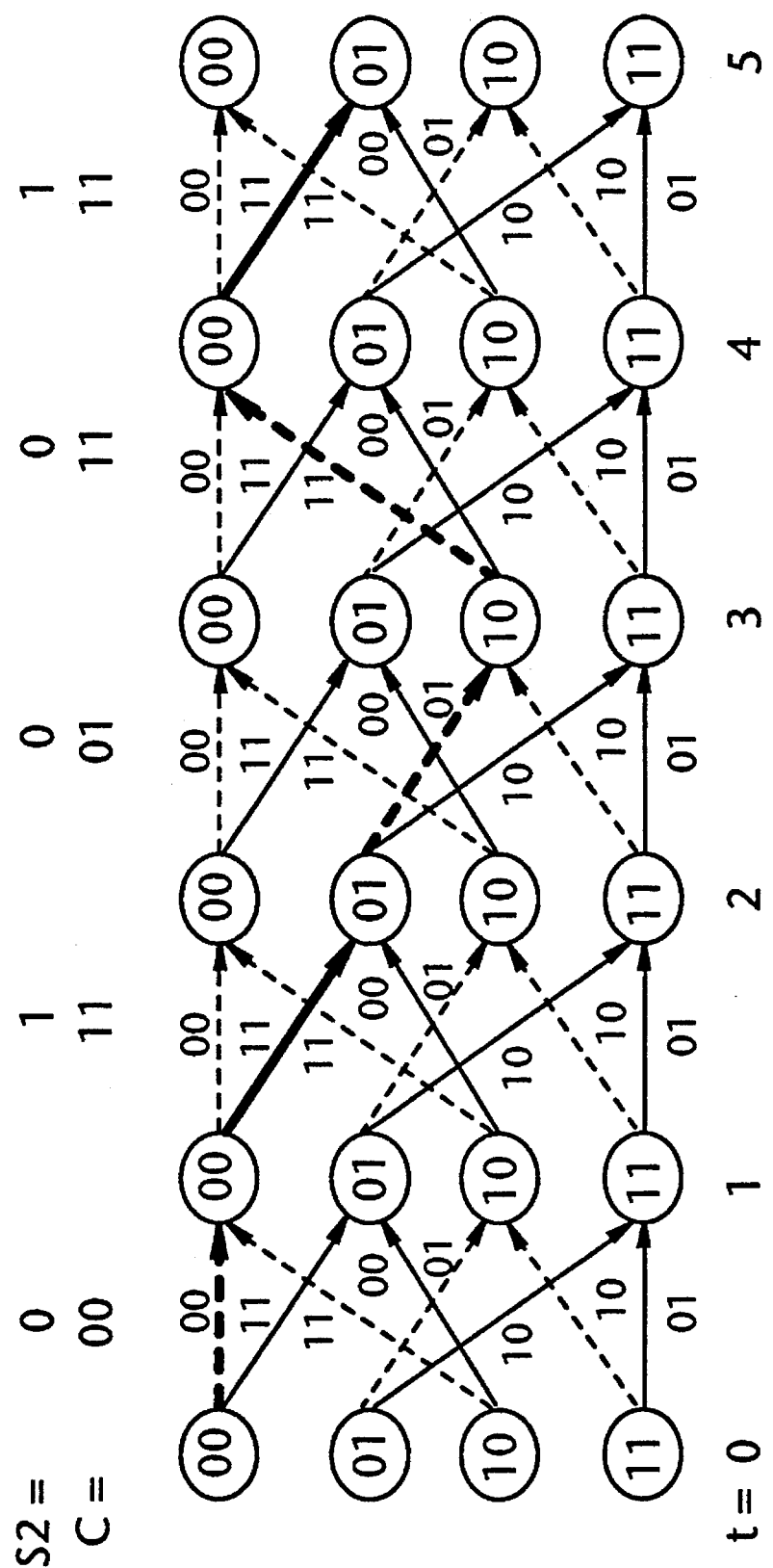
FIG. 4 is a trellis diagram for further describing the operations of the convolutional encoder in FIG. 1.
Figure 5:
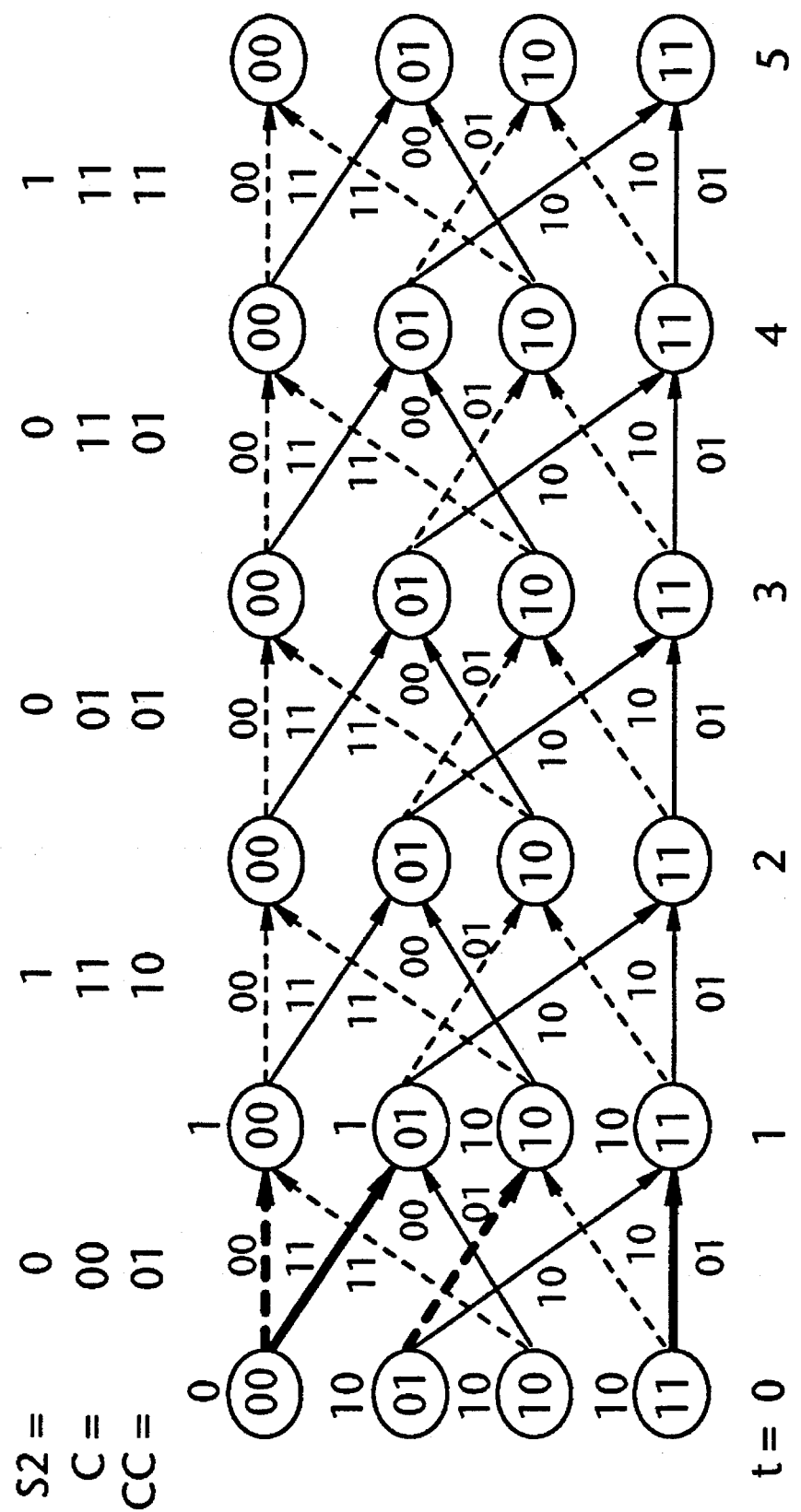
FIGS. 5 and 6 each is a trellis diagram for describing the operations of a maximum-likelihood decoder in FIG. 1.
Figure 6:
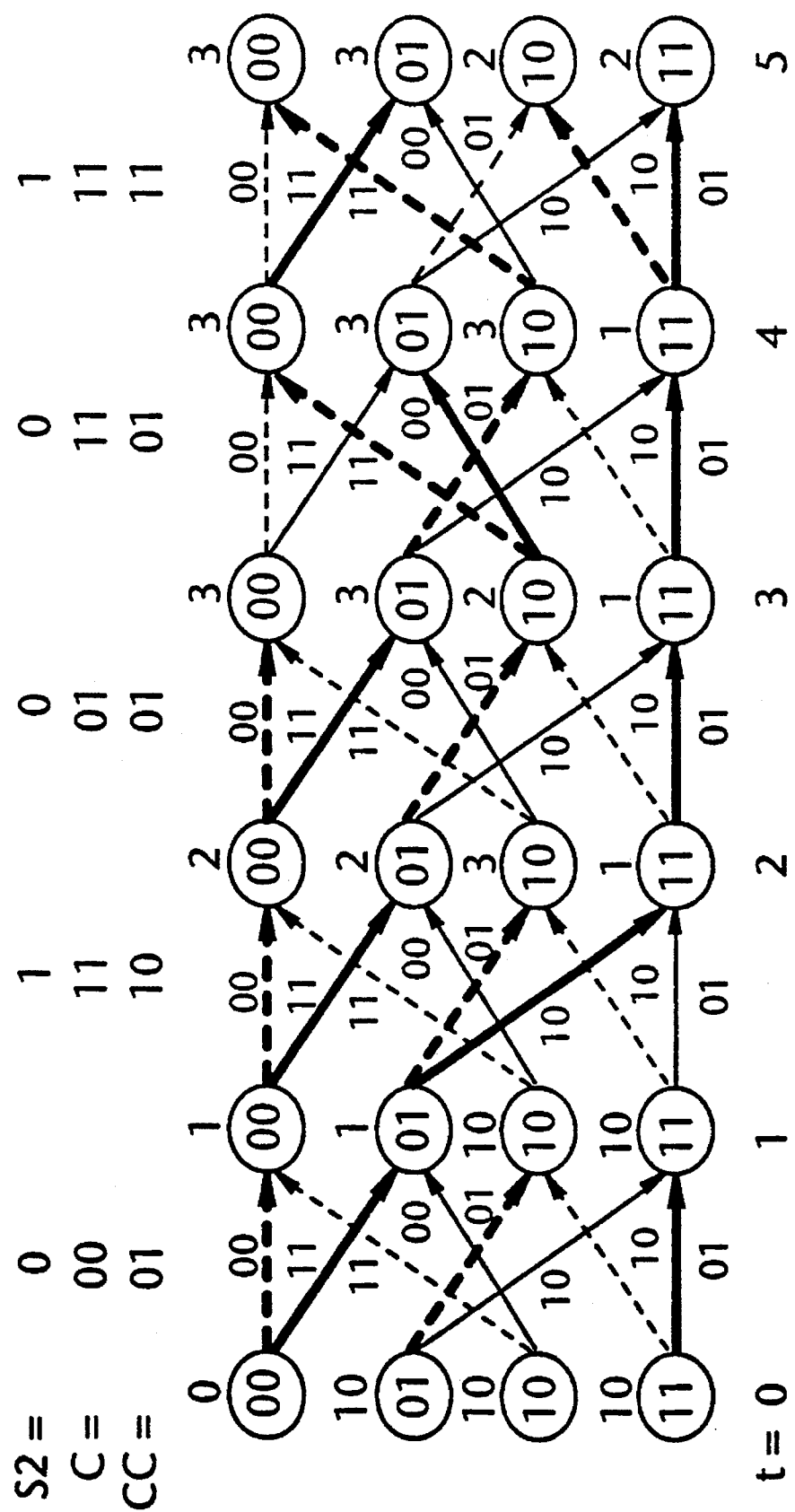

The transmitter 12a is provided with a speech signal source 18a, a speech signal encoder 20a, and a convolutional encoder 22a which respectively correspond to the counterparts 18, 20 and 22 of FIG. 1. On the other hand, the receiver 14a includes a maximum-likelihood (viz., Viterbi) decoder 50, a speech signal decoder 52, a characteristic value extractor 54, a probability variable detector 56, a probability variable table 58, and a weighing factor generator 60, all of which are coupled as shown.

The speech signal source 18a generates an analog speech signal S1. The source encoder 20a digitizes the signal S1, encoding the digitized speech signal, and dividing same into a plurality of consecutive frames each having a frame length of 40 ms (for example).

In order to transmit a speech signal less than 8 k bits/second with a high quality while saving redundant bits, a phonetically-based framing or segmentation of a speech signal is known in the art. For each framing or segment class, a distinctive coding scheme based on CELF (Code Excited Linear Prediction) is employed.

For details of the CELF, reference should be made to a paper by Ira A. Gerson, et al., entitled "Combined Speech and Channel Coding at 11.2 kbps", pages 1339–1342, Signal Processing V: Theories and Applications, Elsevier Science Publishers B.V., 1990 (Prior Reference 2). Further, for details of the phonetically-based framing, reference should be made to papers by Shihua Wang, et al., entitled "Phonetically-Based Vector Excitation Coding of Speech at 3.6 kbps", pages 49–52, CH2673-2/89/0000-0049, 1989 IEEE (Prior Reference 3).

It is assumed that each frame is classified, using two bits, into four different modes: an onset, unvoiced, steady-state voiced, amd transient voiced modes. Two bits indicating one of the four modes are the first two bits of each frame which consists of the predetermined number of bits (160 bits for example) depending on information compression scheme, etc.

The two consecutive bits indicating one of the four modes are not necessarily the first two bits but may be located anywhere in a frame. In such a case, the following discussion has to slightly be modified. Such modification is readily understood by those skilled in the art.

As in the prior art discussed above, it is assumed that a bit sequence S2 from the source encoder 22a is represented by $$S2=(0\ 1\ 0\ 0\ 1\ \ldots) \quad (5)$$

The first two bits "01" of the bit sequence S2 are, in this case, "mode data" indicating one of the above mentioned four modes. The bit sequence S2 is applied to the convolutional encoder 22a which generates the following bit sequence C as mentioned above.

$$C=(00\ 11\ 01\ 11\ 11\ \ldots) \quad (6)$$

It is further assumed that the bit sequence applied to the receiver 14a (depicted by "CC") is degraded as indicated below during transmission over the channel 16.

$$CC=(01\ 10\ 01\ 01\ 11\ \ldots) \quad (7)$$

The transmitted signal CC is fed to the maximum-likelihood decoder which operates under the Viterbi algorithm.

The transmitter 12a per se is not directly concerned with the present invention, and thus, further discussion thereof is omitted for brevity.

Figure 8:
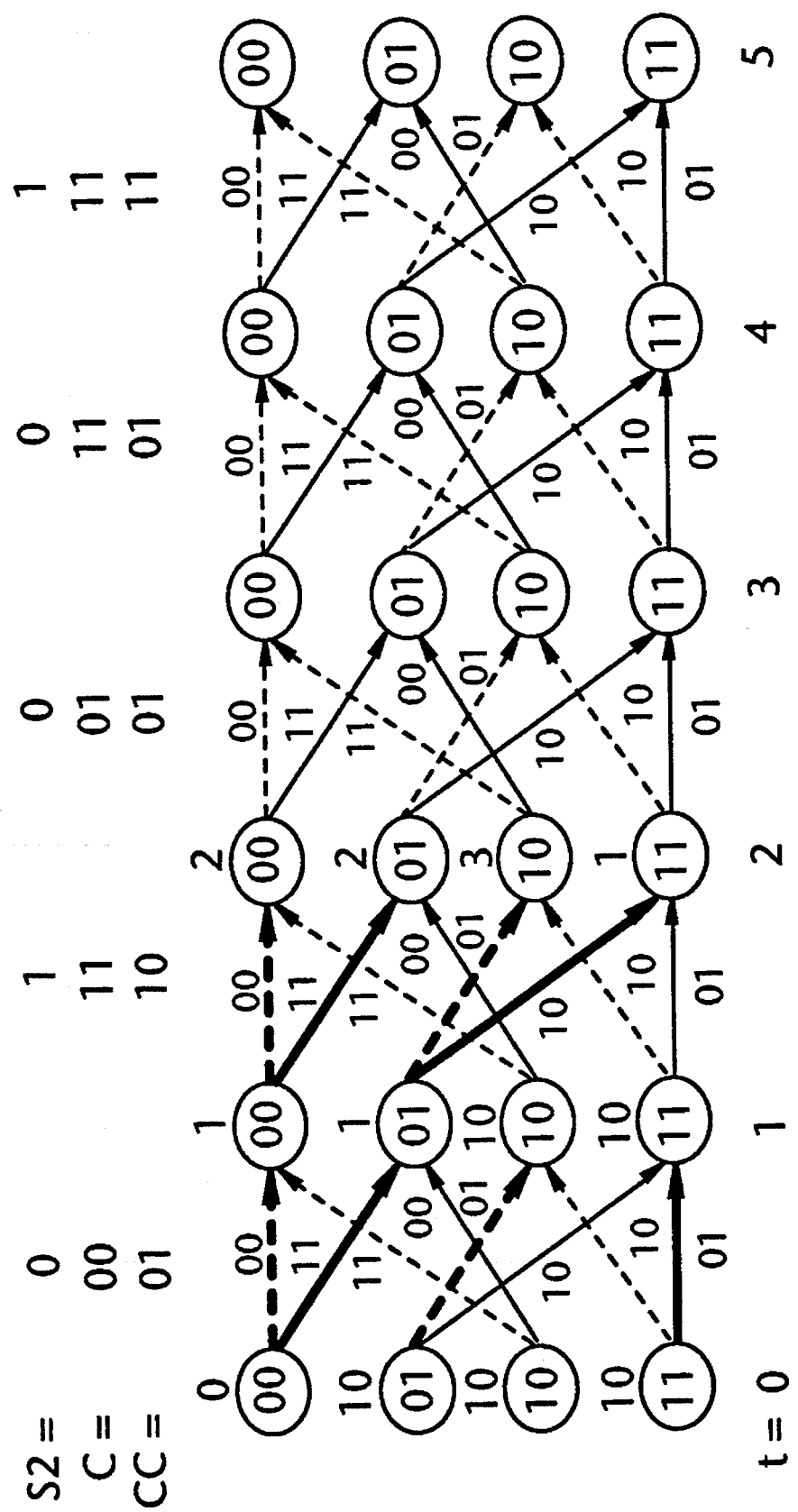
FIGS. 8–10 each is a trellis diagram for discussing the operations of the first embodiment.

As mentioned above, the decoder 50 is initialized, before receiving a new frame, such that the path metric of the encoder state (00) at t=0 is set to 0 (decimal) while each of the remaining path metrics of the other states (01), (10) and (11) at t=0 is set to a sufficiently large number such as 10 (decimal) (for example) as shown in FIG. 8.

The decoder 50 decodes the first four bits (viz., encoded "mode" bits) of the transmitted signal CC in a conventional manner at t=1 and t=2. In FIG. 8, the four decoder states (00), (01), (10) and (11) at t=2 corresponds respectively to the four modes "00", "01", "10" and "11" (for example). Thereafter, the decoder 50 changes a metric path of each of the four decoder states at t=2 using four weighing factors W0–W3 which have been obtained by calculating the probability variables P0–P3 outputted from the probability detector 56. The probability variables P0–P3 are produced based on four characteristic values of the frame immediately preceding the current frame which is now decoded at the maximum-likelihood (Viterbi) decoder 50.

Let it be assumed that the mode of the preceding frame is the same as that of the current frame (viz., "01"). Under such an assumption it is further assumed that the variables P0–P3 take the following values:

P0=0.1
P1=0.7
P2=0.1
P3=0.1

The decoder 50 determines the four weighing factors W0–W3 using the probability variables P0–P3 as follows.

$$Wi=(-1)\times Pi+1.25 \ (i=0,\ 1,\ 2,\ \text{and}\ 3) \quad (8)$$

Therefore, the weighing factors W0–W3 take the following variables in this particular case.

W0=1.15
W1=0.55
W2=1.15
W3=1.15

Figure 9:
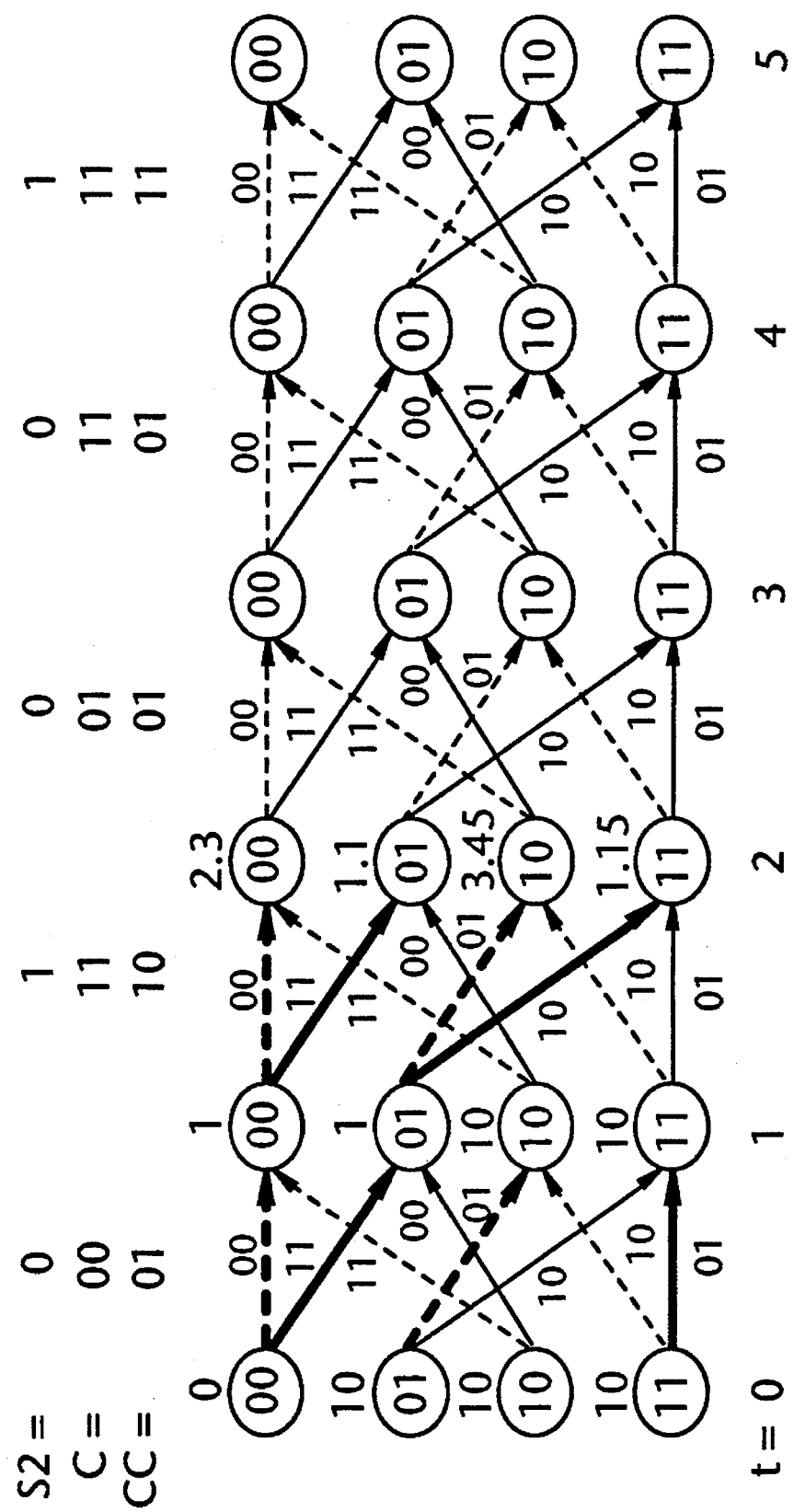

After determining the weighing factors W0–W3, the maximum-likelihood decoder 50 multiplies the path metrics at t=2 (viz., 2, 2, 3 and 1 (decimal numbers)) by W0, W1, W2 and W3, respectively. Thus, the four path metrics at t=2 are changed to "2.3", "1.1", "3.45" and "1.15" as shown in FIG. 9.

Figure 10:
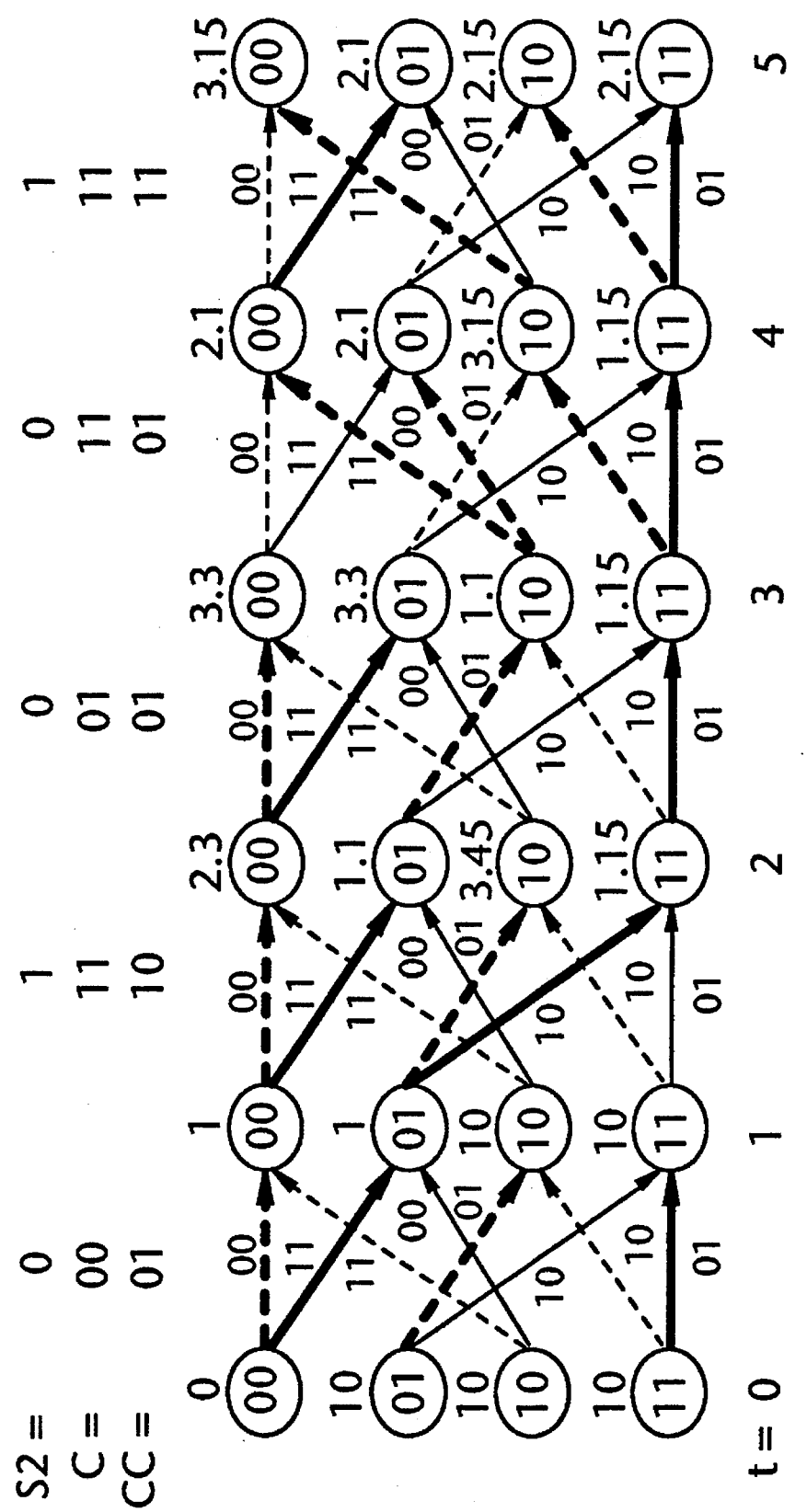

The error-correct decoding after t=2 is implemented in a conventional manner. FIG. 10 shows the survivor paths up to t=5, which are highlighted in the figure, together with the path metrics from t=0 to t=5. As shown in FIG. 10, the path metric of the state $(01)_{t=5}$ exhibits the smallest one. Thus, a decoded bit sequence S2' outputted from the maximum-likelihood decoder 24 becomes as follows.

$$S2''=(0\ 1\ 0\ 0\ 1\ \ldots)$$

It is understood that the decoded bit sequence S2" is the same as the original bit sequence S2. This means that the bit sequence S2 is correctly reproduced.

The weighing factors W0–W3 are obtained using expression (8) which, however, may be subject to change depending on practical conditions of encoding and decoding stages, transmission characteristics over the channel 16a, etc.

How to produce the above mentioned probability values P0–P3 is described in the following.

Figure 11:
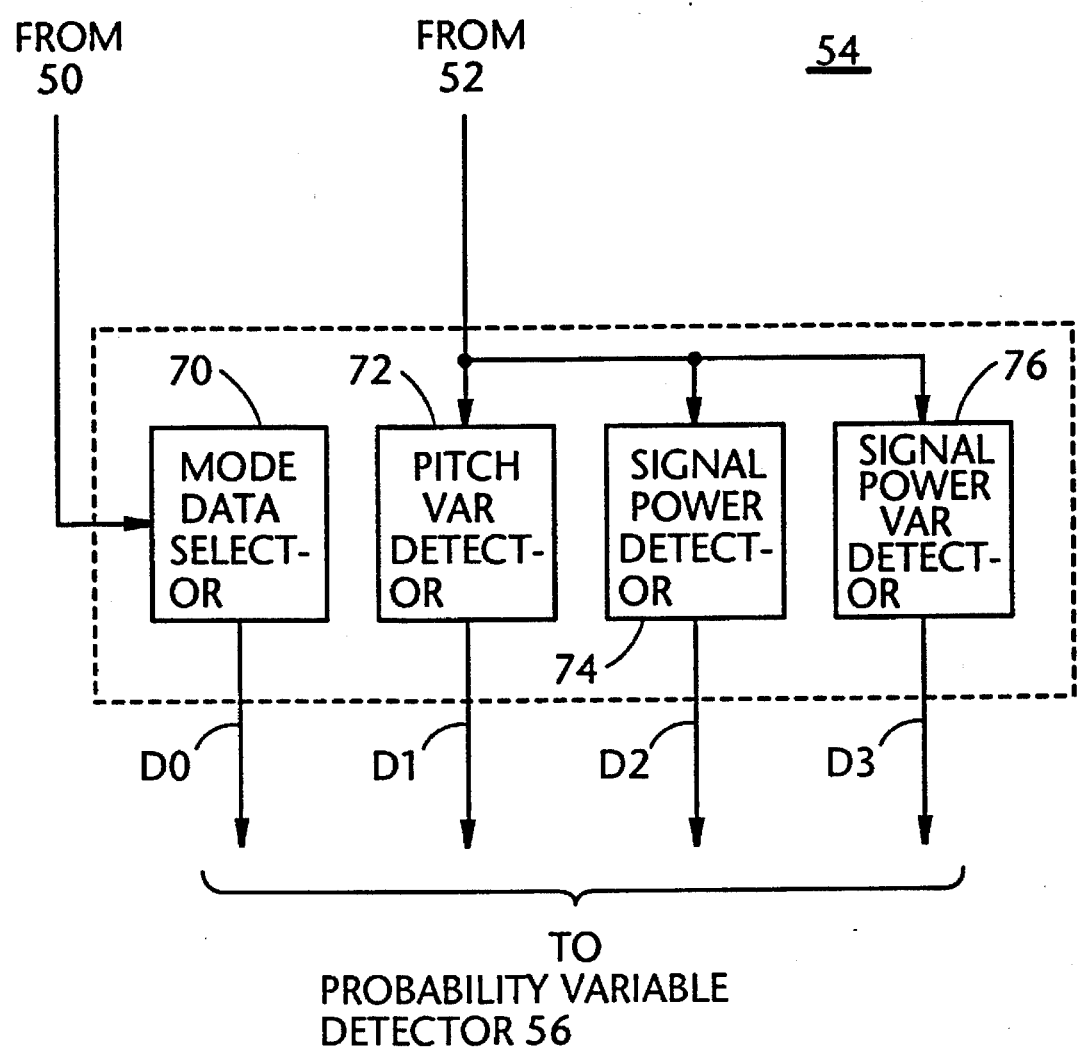
FIG. 11 is a block diagram showing in detail one block in FIG. 7.

Referring to FIG. 11, the characteristic value extractor 54 is shown in detail. As shown, the extractor 54 includes a mode data selector 70 which receives a decoded frame from the maximum-likelihood decoder 50 and selects the first two bits in this particular embodiment. The selected mode data of two bits are applied to the probability variable detector 56.

The characteristic value extractor 54 further includes a pitch variation detector 72, a signal power detector 74, and a signal power variation detector 76. Thus, the extractor 54 is arranged to extract four different characteristic values from the frame which is outputted from the decoder 50. These characteristic values are used to produce P0–P3 which are applied to the weighing factor generator 60 in order to control the decoding of the next frame at the maximum-likelihood decoder. The next frame implies the frame immediately following the currently decoded frame.

The pitch variable detector 72 detects a difference between the average speech signal pitches of the leading and trailing halves of the decoded frame from the maximum-likelihood decoder 50. The signal power detector 74 detects a speech signal power of the same frame. On the other hand, the signal power variation detector 76 detects a power difference between the leading and trailing halves of the same frame. These characteristic values (depicted by D0–D3) are fed to the probability variable detector 56.

It is assumed that the outputs D0–D3 of the blocks 70, 72, 74 and 76 indicate the following information:

TABLE 1

(1) D0: 01 (mode data)
(2) D1: 3 (ms)
(3) D2: 20 (dB)
(4) D3: 5 (dB)

The probability variable detector 56 receives one set of the characteristic data D0–D3 and detects the four probability variables P0–P3 by referring to the probability variable table 58 part of which is shown below by way of example.

TABLE 2

| Index | D0 | D1   | D2    | D3        | P0  | P1  | P2  | P3  |
|-------|----|------|-------|-----------|-----|-----|-----|-----|
| 0     | 00 | 0–9  | 0–9   | (–)99–(–)80 | 0.8 | 0.1 | 0.1 | 0.0 |
| 1     | 00 | 0–9  | 0–9   | (–)79–(–)60 | 0.7 | 0.2 | 0.1 | 0.0 |
| .     |    |      |       |           |     |     |     |     |
| 399   | 00 | 30–39 | 90–99 | 80–99     | 0.0 | 0.1 | 0.1 | 0.7 |
| 400   | 01 | 0–9  | 0–9   | (–)99–(–)80 | 0.8 | 0.1 | 0.1 | 0.0 |
| .     |    |      |       |           |     |     |     |     |
| 420   | 01 | 0–9  | 20–29 | 0–19      | 0.1 | 0.1 | 0.3 | 0.5 |
| .     |    |      |       |           |     |     |     |     |
| 799   | 01 | 30–39 | 90–99 | 80–99     | 0.1 | 0.7 | 0.1 | 0.1 |
| 800   | 10 | 0–9  | 0–9   | (–)99–(–)80 | 0.4 | 0.2 | 0.3 | 0.1 |
| .     |    |      |       |           |     |     |     |     |
| 1199  | 10 | 30–39 | 90–99 | 80–99     | 0.3 | 0.2 | 0.4 | 0.1 |
| 1200  | 11 | 0–9  | 0–9   | (–)99–(–)80 | 0.2 | 0.1 | 0.2 | 0.5 |
| .     |    |      |       |           |     |     |     |     |

TABLE 2-continued

| Index | D0 | D1   | D2    | D3    | P0  | P1  | P2  | P3  |
|-------|----|------|-------|-------|-----|-----|-----|-----|
| .     |    |      |       |       |     |     |     |     |
| 1599  | 11 | 30–39 | 90–99 | 80–99 | 0.0 | 0.1 | 0.4 | 0.5 |

The data in TABLE 2 are determined by implementing a practical analysis of a speech signal.

When a set of the characteristic values D0–D3 issued from the extractor 54 correspond to the index No. 420 of TABLE 1, the probability variables P0–P3 are respectively "0.1", "0.1", "0.3", and "0.5". Subsequently, the weighing factor generator 60 calculates the weighing factors W0–W3 using expression (8). These factors W0–W3 are applied to the maximum-likelihood decoder 50 for changing the path metrics at t=2 of the next coming frame.

The first embodiment is to allow the Viterbi decoder to achieve a very reliable error correction by taking advantage of strong or close correlation between two consecutive frame data.

Figure 12:
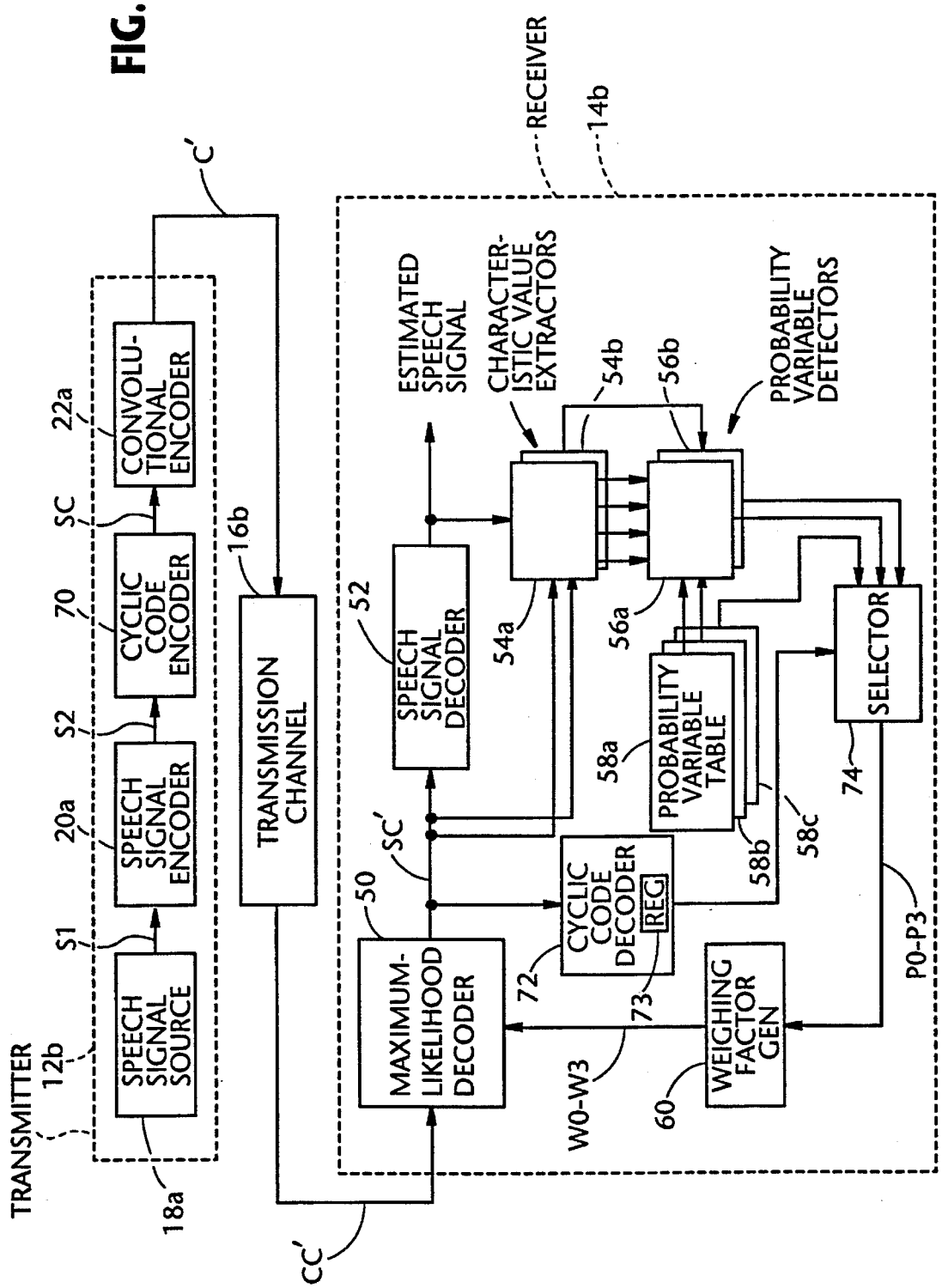
FIG. 12 is a block diagram showing a second embodiment of the present invention.

FIG. 12 is a block diagram showing an arrangement of a second embodiment of the present invention, which generally includes a transmitter 12b and a receiver 14b interconnected via a transmission channel 16b.

The arrangement of FIG. 12, when compared with that of FIG. 7, further includes a cyclic code encoder 70, a cyclic code decoder 72 and a selector 74. Further, the second embodiment includes a plurality of characteristic value extractors 54a and 54b, a plurality of probability variable detectors 56a and 56b, and a plurality of probability variable tables 58a–58c. The blocks of FIG. 12 which have been referred to in the first embodiment, are described where such discussion provides context for the description of the second embodiment.

As is well known, cyclic codes form an important subclass of the liner codes and they possess many algebraic properties that simplify encoding and decoding implementations. The encoding and decoding of cyclic codes per se are well known in the art and are not directly relevant to the instant invention and accordingly, the detailed descriptions thereof are not given in the instant disclosure.

The cyclic code encoder 70 adds, as a redundant bit stream, a generator polynomial of degree 16 (for example) to the signal S2 applied thereto from the speech signal encoder 20a. The convolutional encoder 22a carries out encoding of the output of the cyclic code encoder 70 in the same manner as discussed with the first embodiment.

As in the first embodiment, the maximum-likelihood decoder 50 receives the weighing factors W0–W3 from the block 60 and changes the path metrics at t=2 (FIG. 9). That is to say, the decoder 50 of the second embodiment operates likewise as the counterpart of the first embodiment.

The cyclic code decoder 72 checks to see if the cyclic code involved in each frame received is identical to one of the original cyclic codes (viz., whether or not the cyclic code received is contaminated during the transmission). The cyclic code decoder 72 has a register 73 which stores two bits indicating the cyclic code check results. That is, the first bit of the register 73 demonstrates the check result of the cyclic code of a current frame. On the other hand, the second bit of the register 73 represents the check result of the cyclic code of a frame immediately preceding the current frame. By way of example, each of the first and second bits of the register 73 assumes a logic level "0" when the cyclic code decoder 72 detects an error in the cyclic code received, while each of the first and second bits of the registers assumes a logic "1" when the decoder 72 detects no error in the received cyclic code. The contents of the register 73 are applied to the selector 74.

In FIG. 12, the cyclic code decoder 72 includes the register 73. However, the register 73 may be separately provided between the blocks 72 and 74.

The characteristic value extractor 54a is configured in exactly the same manner as the extractor 54 of the first embodiment, and applying the outputs thereof to the probability variable detector 56a. For the sake of convenience, the arrangement of the extractor 54a is again illustrated in FIG. 13.

Figure 14:
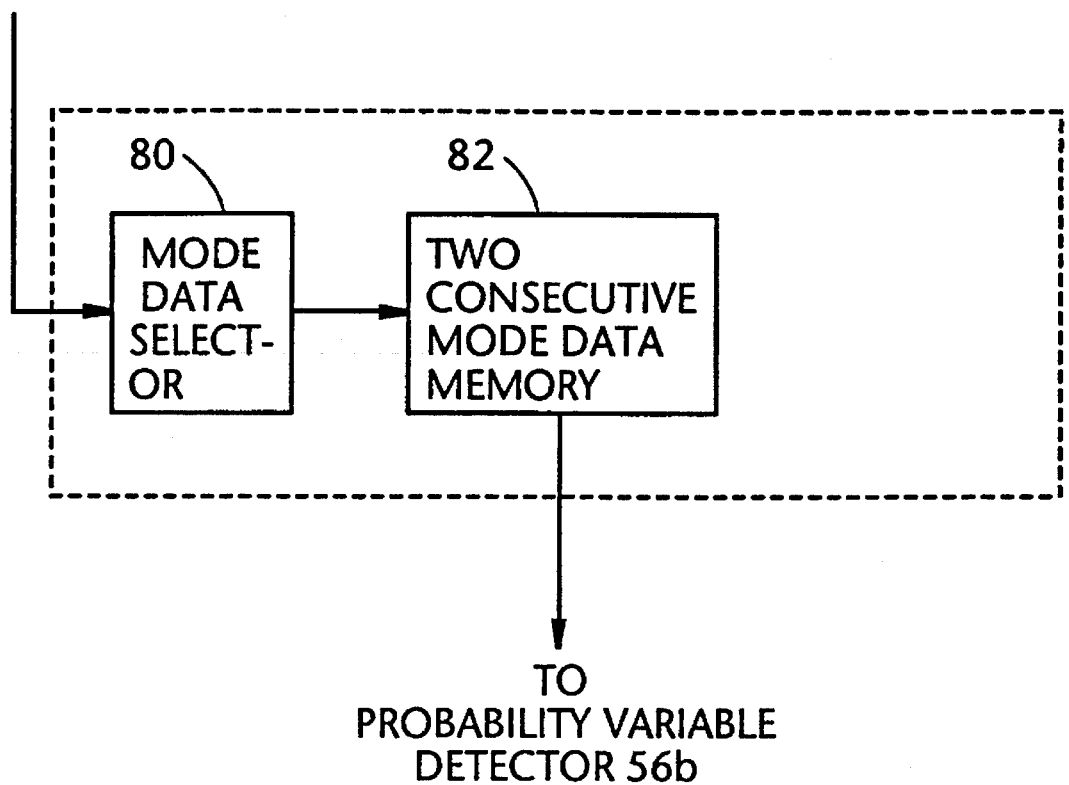
FIG. 14 is a block diagram showing one block in FIG. 12.

FIG. 14 shows the configuration of the other characteristic value extractor 54b which, in the instant embodiment, includes a mode data selector 80 and a memory 82. The mode data selector 80 functions in the same manner as the mode data selector 70 of FIG. 11, while the memory 82 stores two consecutive mode data: one is the mode data currently decoded in the maximum-likelihood decoder 50 and the other is the mode data of the frame preceding the current frame. The two consecutive mode data are applied to the probability variable detector 56b for controlling the maximum-likelihood decoding of the next frame.

The probability variable table 58a stores the same data as the block 58 of FIG. 7. The other table 58b includes 16 sets of probability variables which are respectively associated with 16 combinations of two consecutive mode data in this particular case. This is because each frame may take one of the four modes. An example of the contents of the table 58b are shown in TABLE 3.

TABLE 3

| Mode data #1 (two bits) | Mode data #2 (two bits) | P0 | P1 | P2 | P3 |
|---|---|---|---|---|---|
| 00 | 00 | 0.8 | 0.1 | 0.1 | 0.0 |
| 00 | 01 | 0.2 | 0.3 | 0.2 | 0.3 |
| . | . | . | . | . | . |
| . | . | . | . | . | . |
| 10 | 01 | 0.5 | 0.4 | 0.1 | 0.0 |
| . | . | . | . | . | . |
| . | . | . | . | . | . |
| 11 | 11 | 0.1 | 0.3 | 0.3 | 0.3 |

In TABLE 3, "Mode data #1" implies the mode data (2 bits) of the current frame which is now decoded at the block 50 while "Mode data #2" is the mode data of the frame which precedes the current frame.

The data in TABLE 3 are determined by implementing a practical analysis of a speech signal.

The table 50c has previously stored one set of probability variables of P0–P3 each of which takes the same value (via., 0.25).

In brief, the second embodiment is to control or change the decoding coefficients of the maximum-likelihood decoder 50 (viz., the path metrics at t=2 in this particular case) depending on the results of the cyclic code check implemented at the decoder 72.

Figure 13:
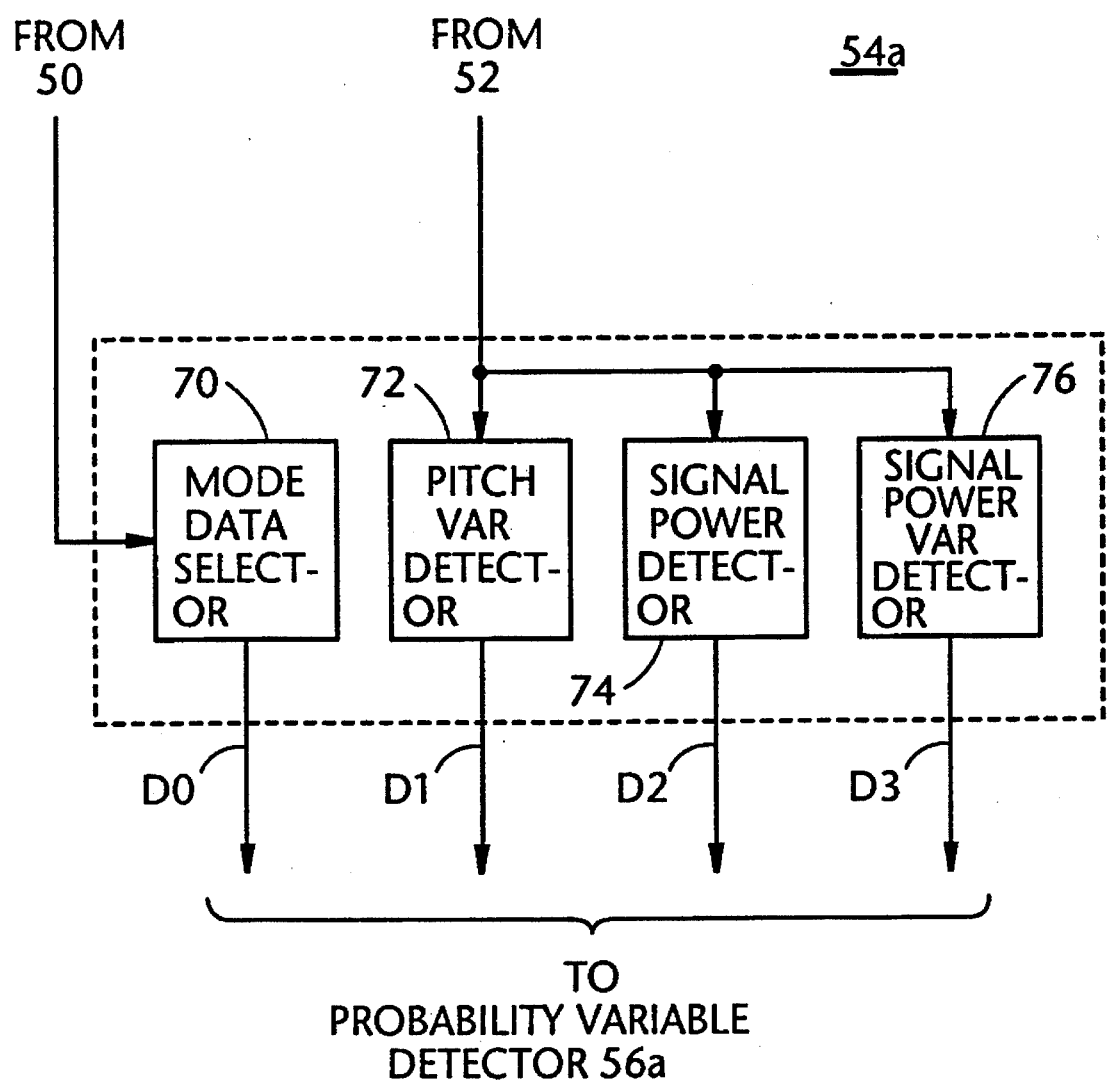
FIG. 13 is a block diagram showing in detail one block in FIG. 12, this figure being substantially identical with FIG. 11.

The operations of the second embodiment are discussed with reference to FIGS. 12–14.

The second embodiment has three operation modes (depicted by first, second and third operation modes in the following).

The first operation mode is that the cyclic code decoder 72 issues the check result indicating that the cyclic code of the current frame includes no error (viz., the first bit of the register 73 is a logic "1"). In this case, the check result of the cyclic code in the preceding frame is not considered. The selector 74, in response to the output of the decoder 72 (viz., the output of the register 73), allows the probability variable detector 56b to apply the output thereof to the weighing factor generator 60. The first operation mode is identical to the operation of the first embodiment. As in the first embodiment, the current frame decoding is controlled by the mode data of the preceding frame.

The second operation mode is that the cyclic code decoder 72 generates two check results: one result indicates that the cyclic code of the current frame includes an error (viz., the first bit stored in the register is a logic "0"), and the other result indicates the preceding frame includes no error (viz., the first bit stored in the register is a logic "1"). In the second operation mode, the selector 74 works such as to pass the output of the probability variable detector 56b to the weighing factor generator 60. It is to be noted that the probability variables P0–P3 applied to the weighing factor generator 60 are utilized to control the maximum-likelihood decoding of the next frame (viz., the frame which follows the currently decoded frame).

In the second operation mode, the cyclic code of the currently decoded frame is detected incorrect and thus, it is expected that the corresponding speech signal reproduced at the speech signal decoder 52 is not reliable compared with that in the first operation mode. However, since the preceding frame includes a correct cyclic code, it is assumed that the mode data of the frame currently decoded at the decoder 50 has been correctly transmitted to the receiver 14b. Thus, it is expected that correlation exists between the currently error-correct decoded and preceding frames. Under these assumptions, the maximum-likelihood decoder 50 implements the error-correct decoding on the next incoming frame in consideration of the correlation between the preceding two frames.

The third operation mode is that the cyclic code decoder 72 generates check results which indicate that both of the cyclic codes of the current and preceding frames are not correct (viz., each of the first and second bits stored in the register is a logic "0"). In the this mode, the selector 74 is responsive to the output of the cyclic code decoder 72 and allows the probability variable table 58c to be applied to the weighing factor generator 60. As mentioned above, in the third operation mode, the probability variables P0–P3 thus obtained are identical with each other. This means that the decoder 50 decodes the next frame without considering any correlation between the currently error-correct decoded frame and the preceding frame. That is to say, the third operation mode is the same as the prior art.

The instant invention has been discussed such that each frame of the signal to be transmitted is classified into the four modes. However, the number of frame modes can be increased more than four if necessary.

Further, a cyclic code has been used in order to check or determine whether or not a transmitted signal is contaminated over the transmission channel. However, other suitable error detection technique can be used to achieve the same purpose.

It will be understood that the above disclosure is representative of only two possible embodiments and that various modifications can be made without departing from the concept of the invention.

What is claimed is:

1. An apparatus for error-control coding, which includes a data transmitter and a data receiver interconnected via a transmission channel, said data receiver including:

first means (50, 60) for successively error-correct decoding a plurality of data frames which have been error-correct encoded at said transmitter, said first means changing decoding parameters in response to control data applied thereto, said control data being generated based on one or more than one data frames preceding a data frame currently decoded at said first means;

second means (52) coupled to said first means for decoding output of said first means;

third means (54, 54a–54b), coupled to receive outputs of said first and second means, for extracting frame characteristic data therefrom; and fourth means (58, 58a–58c, 56, 56a–56b) coupled to said third means, said fourth means being responsive to said frame characteristic data and detecting one of a plurality of probability variable sets stored in said fourth means, said fourth means applying said one of a plurality of probability variable sets to said first means as said control data.

2. An apparatus as claimed in claim 1, wherein said transmitter includes:

a signal source which issues an original signal to be transmitted to said receiver;

a source encoder for encoding said original signal; and a convolutional encoder, preceded by said source encoder, for error-correct encoding output of said source encoder.

3. An apparatus as claimed in claim 1, wherein said first means includes:

a maximum-likelihood decoder (50); and fifth means (60) coupled between said maximum-likelihood decoder and said fourth means, and fifth means receiving said control data from said fourth means and calculating weighting factors using said control data, said weighing factors being used for changing said decoding parameters of said maximum-likelihood decoder.

4. An apparatus as claimed in claim 1, wherein said fourth means generates a plurality of probability variable sets in response to said frame characteristic data, and wherein said receiver further including:

sixth means (72) coupled to said first means for checking a data transmission error in the output of said first means, said sixth means generating a check result therefrom; and seventh means (74) coupled to said first, fourth and sixth means, said seventh means being responsive to said check result for selecting one of said plurality probability variable sets outputted from said fourth means and for applying said one of said plurality probability variable sets to said first means as said control data.

5. An apparatus as claimed in claim 4, wherein said sixth means is a cyclic code decoder.

6. An apparatus as claimed in claim 5, wherein said transmitter further includes a cyclic code encoder.

7. An apparatus for error-control coding, which includes a data transmitter and a data receiver interconnected via a transmission channel, said data receiver including:

first means (50, 60) for successively error-correct decoding a plurality of data frames which have been error-correct encoded at said transmitter, said first means changing decoding parameters in response to control data applied thereto, said control data being generated based on one or more than one data frames preceding a data frame currently decoded at said-first means;

second means (52) coupled to said first means for decoding output of said first means;

third means (54a–54b), coupled to receive outputs of said first and second means, for extracting frame characteristic data therefrom;

fourth means (58a–58c, 56a–56b) coupled to said third means, said fourth means being responsive to said frame characteristic data and detecting a plurality of probability variable sets stored in said fourth means;

fifth means (72) coupled to said first means for checking a data transmission error in the output of said first means, said fifth means generating a check result therefrom; and sixth means (74) coupled to said first, fourth and fifth means, said sixth means being responsive to said check result and selecting one of said plurality probability variable sets outputted from said fourth means and applying said one of said plurality probability variable sets to said first means as said control data.

* * * * *